(12) United States Patent
Frosien et al.

(10) Patent No.: US 6,407,387 B1
(45) Date of Patent: Jun. 18, 2002

(54) PARTICLE BEAM APPARATUS

(75) Inventors: Jurgen Frosien, Riemerling; Stefan Lanio, Erding, both of (DE)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/409,109

(22) Filed: Sep. 30, 1999

(51) Int. Cl.$^7$ .............................................. H01J 37/28
(52) U.S. Cl. ...................................... 250/310; 250/397
(58) Field of Search .................................. 250/310, 397

(56) References Cited

U.S. PATENT DOCUMENTS

| | | | | |
|---|---|---|---|---|
| 4,442,355 A | * | 4/1984 | Tamura et al. | 250/310 |
| 4,896,036 A | * | 1/1990 | Rose et al. | 250/310 |
| 4,926,054 A | * | 5/1990 | Frosien | 250/397 |
| 5,146,090 A | * | 9/1992 | Plies | 250/310 |
| 5,422,486 A | | 6/1995 | Hermann | |
| 5,424,541 A | * | 6/1995 | Todokoro et al. | 250/310 |
| 5,780,859 A | | 7/1998 | Feuerbaum | |
| 6,025,593 A | * | 2/2000 | Suzuki et al. | 250/310 |
| 6,037,589 A | * | 3/2000 | Yonezawa et al. | 250/310 |
| 6,194,729 B1 | * | 2/2001 | Weimer | 250/396 R |

FOREIGN PATENT DOCUMENTS

| | | |
|---|---|---|
| EP | 0 180 723 B1 | 4/1991 |
| EP | 0 333 018 B1 | 6/1994 |

* cited by examiner

*Primary Examiner*—Bruce Anderson
(74) *Attorney, Agent, or Firm*—Muramatsu & Associates

(57) ABSTRACT

The invention relates to a particle beam apparatus with a source for generating a primary particle beam, means for focussing the primary particle beam onto a specimen, means for decelerating back-scattered and/or secondary electrons released at the specimen, said detecting means being located between said source and said focussing means, means for accelerating the primary particle beam from a first energy to a second higher energy and means for decelerating the primary particle beam to a final beam energy. Furthermore, there are provided first additional means to decelerate the primary particle beam shortly before the detecting means and second additional means to accelerate the primary particle beam immediately after the detecting means.

13 Claims, 6 Drawing Sheets

PARTICLE BEAM APPARATUS

Figure 1:
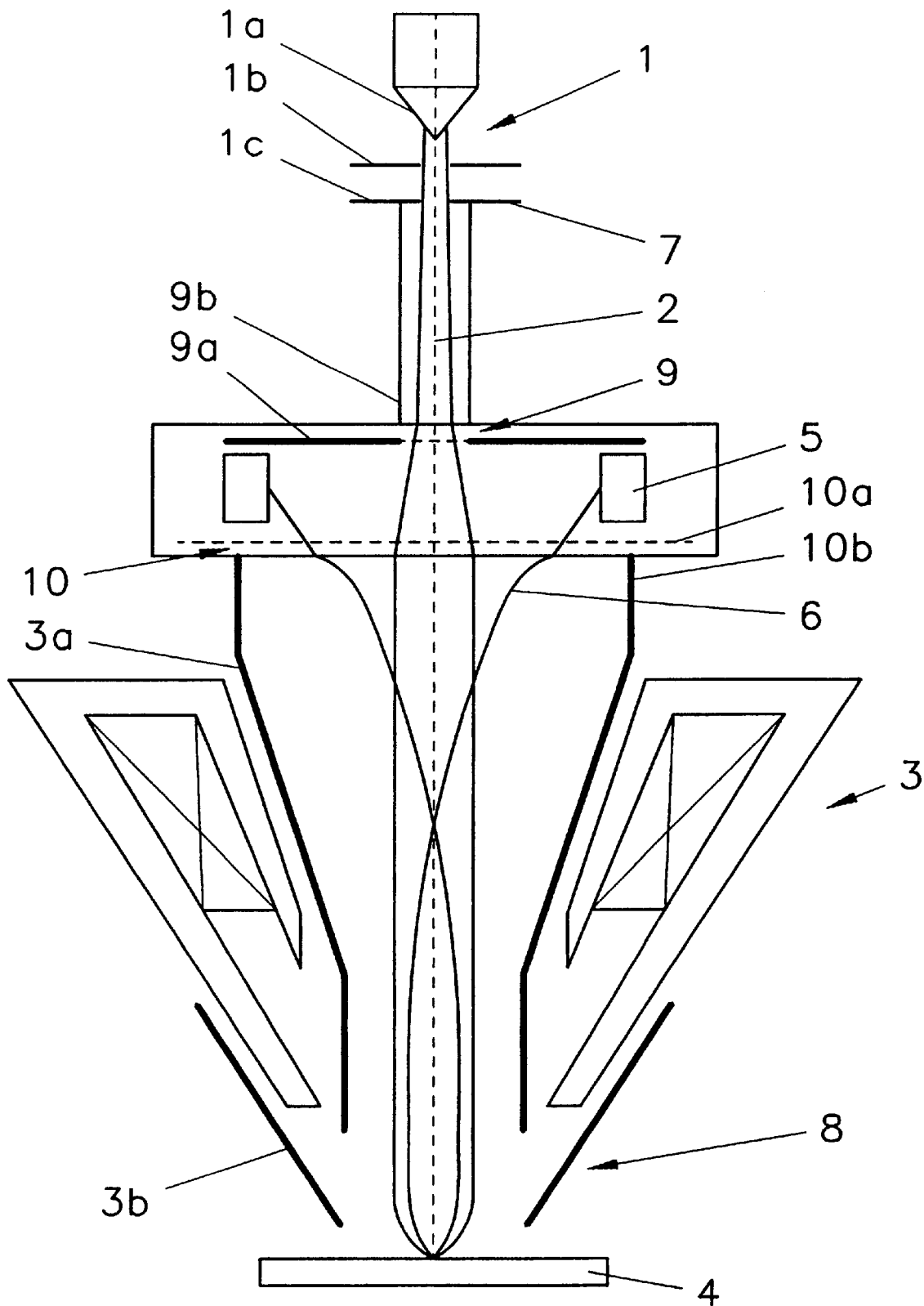

The invention relates to a particle beam apparatus according to the preamble to claim 1.

In particular, the invention concerns a scanning electron microscope for low voltage applications. Low voltage microscopy is extremely important in the imaging of sensitive and non-conductive specimens. Because of the low energy (typically lower than 5 keV), resulting in low energy dissipation, sensitive specimens are not damaged. Insulating specimens can be imaged without distortion and disturbance, because insulators have a secondary electron yield of about 1 in the low energy range, which avoids or minimizes charging effects during the exposure with the particle beam. Low voltage microscopy, consequently, has great importance for the dimensional measurement and the inspection of device structures in the semiconductor manufacturing process.

Presently, high resolution low voltage microscopes are used for the above mentioned applications. High performance microscopes, as described in EP-B-0 333 018, use a combined electrostatic-magnetic immersion lens as final objective lens. By using the immersion principle, the primary beam path is at high energies. The final low beam energy is generated by deceleration in the objective lens, just in front of the specimen (EP-B-0 180 723). By applying such intermediate beam acceleration concepts, the electron-electron interaction inside the column, which broadens the beam and consequently decreases the resolution, can be significantly reduced.

The back-scattered and/or secondary electrons released by the primary electron at the specimen can be detected by a detector located in front of the objective lens. The arrangement of an in-lens or pre-lens detector has the advantage that the specimen can be located very close to the lens, resulting in a short working distance and correspondingly in a short focal length of the objective lens. A short focal length yields low chromatic and spherical aberration coefficients of the objective lens, which means high optical performance for the low voltage application.

The high performance low voltage arrangements according to the state of the art show a good optical performance, which even can even be improved by the application of objective lenses using a combined electrostatic retarding and magnetic single pole lens as described in U.S. Pat. No. 5,780,859. Those arrangements, however, have a drawback in secondary electron detection efficiency. Since the secondary electrons are accelerated by the retarding field for the primary particles, their energy is high and similar to the primary electron energy. Consequently, their behaviour is also similar to that of the primary electron beam. Accordingly, the secondary electron detection is difficult and not very efficient. Therefore, state of the art solutions either use coaxial detectors with small holes for the penetration of the primary beam (EP-B-0 333 018) or means for separation of the primary and the secondary electron beam (U.S. Pat. No. 5,422,486).

It is an object of the invention to provide a particle beam apparatus according to the preamble to claim 1 having an improved back-scattered and secondary electron detection efficiency.

This object is achieved according to the invention by the features of claim 1.

By applying the first and second additional means to decelerate and accelerate the primary particle beam in the region of the detecting means many kinds of effective detection systems can be used, because the back-scattered and/or secondary electrons are decelerated to their original energy distribution by applying a potential in the region of the detector which is close to the potential of the specimen.

Preferably the detector is located in a crossover of the primary been path. In this case, the optical effect of the first and second additional means on the primary beam performance is marginal and can be disregarded, because lenses or optical components in or near a crossover do not have any relevant effect on the beam characteristics.

Figure 2:
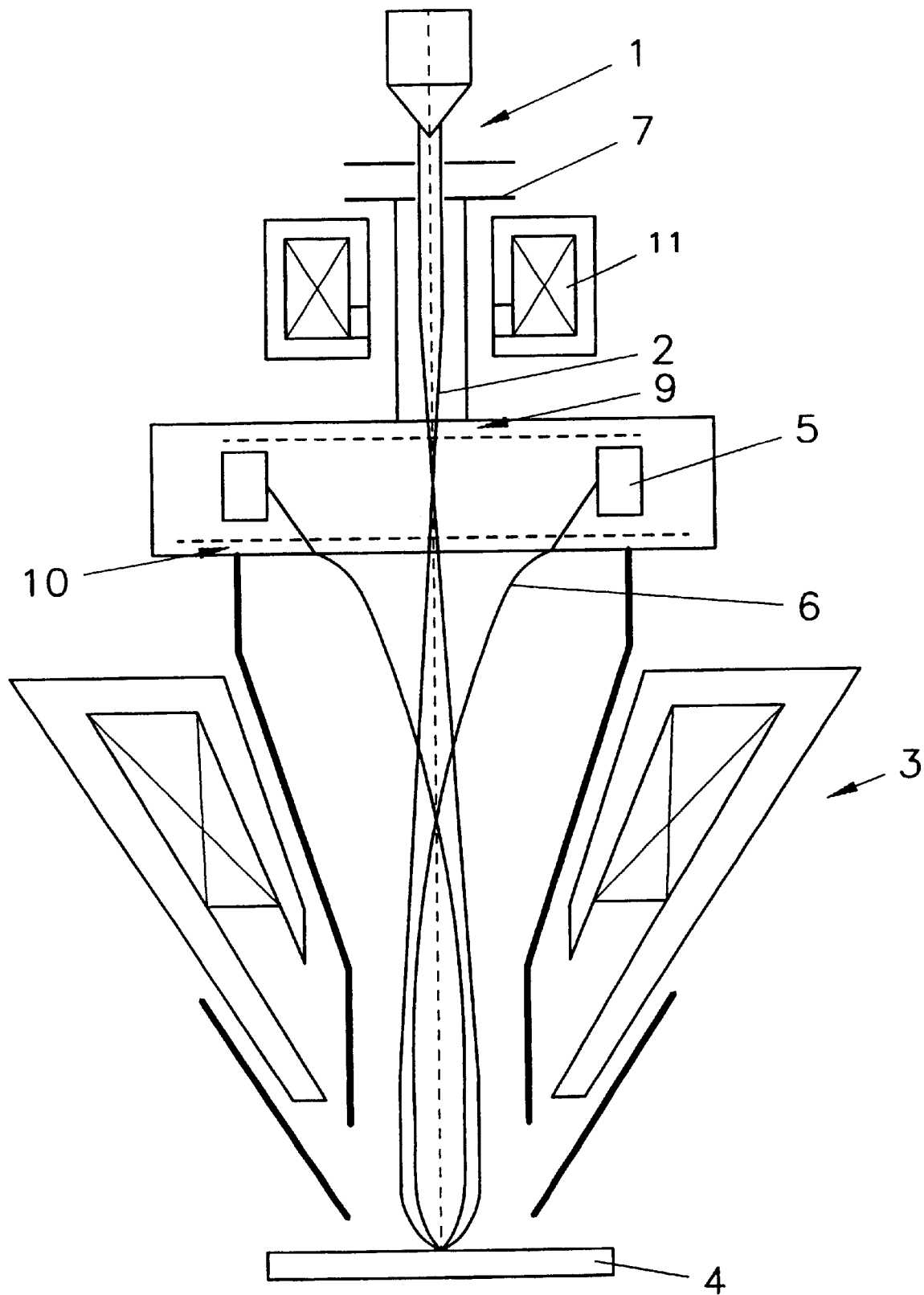
Figure 3:
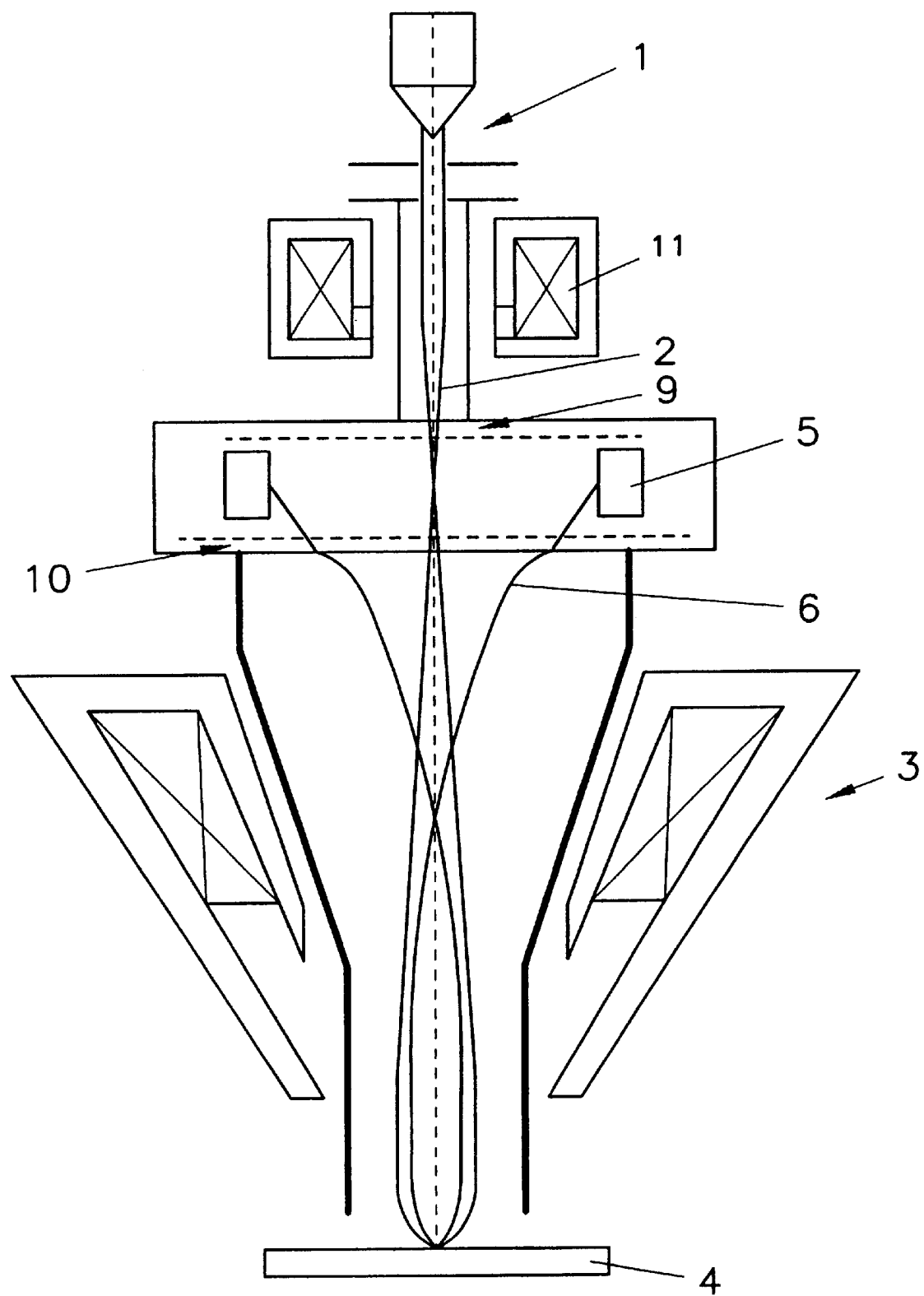
Figure 4:
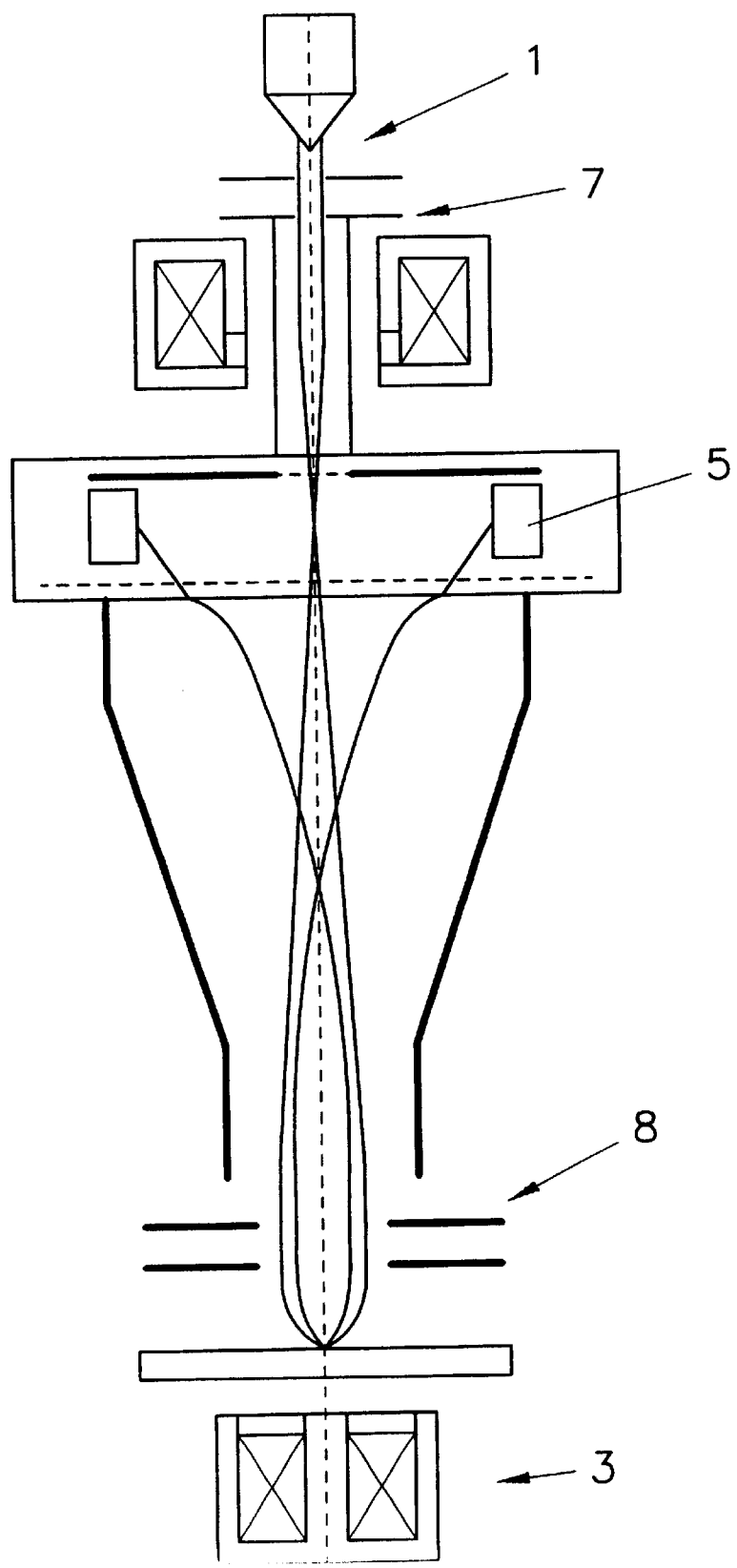
Figure 5:
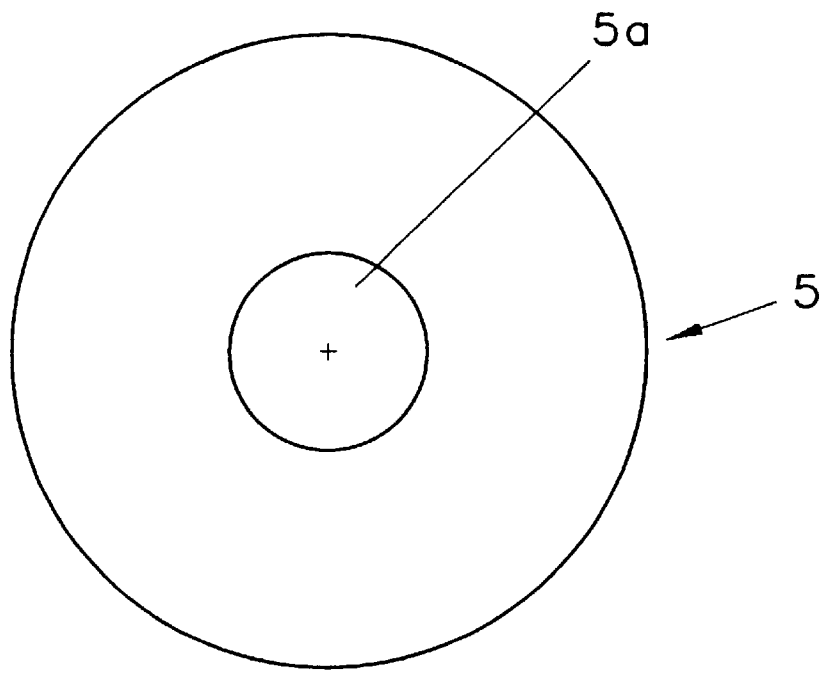
Figure 6:
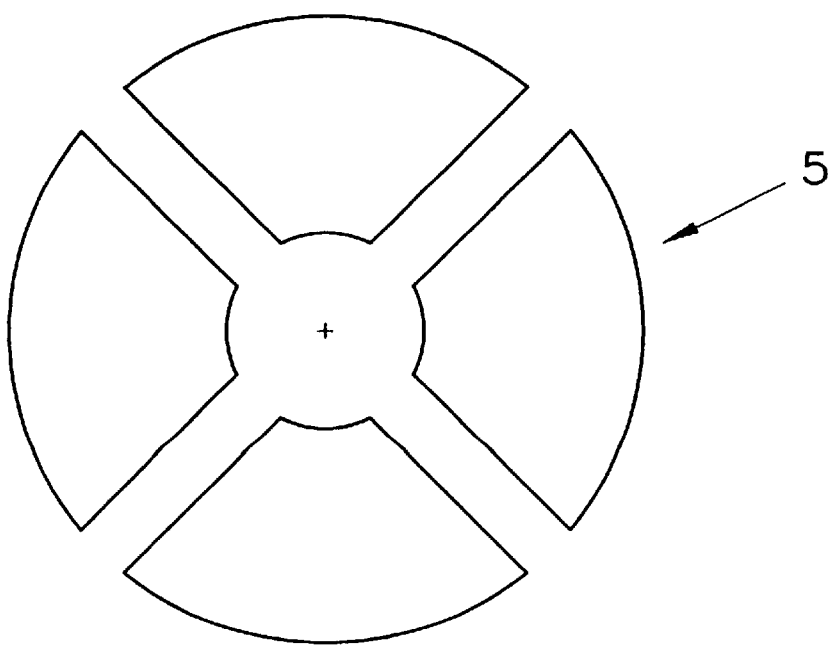
Figure 7:
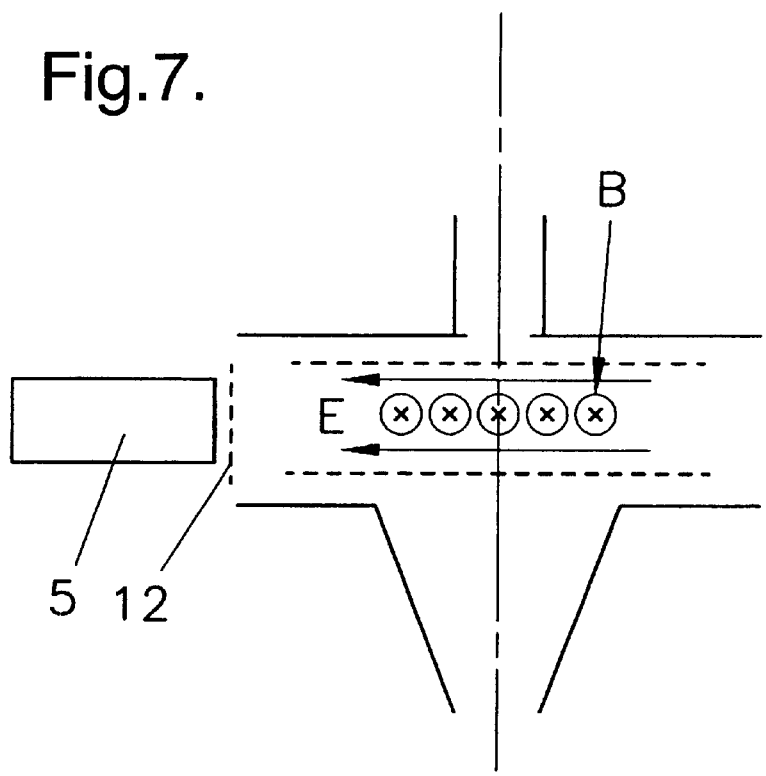
Figure 8:
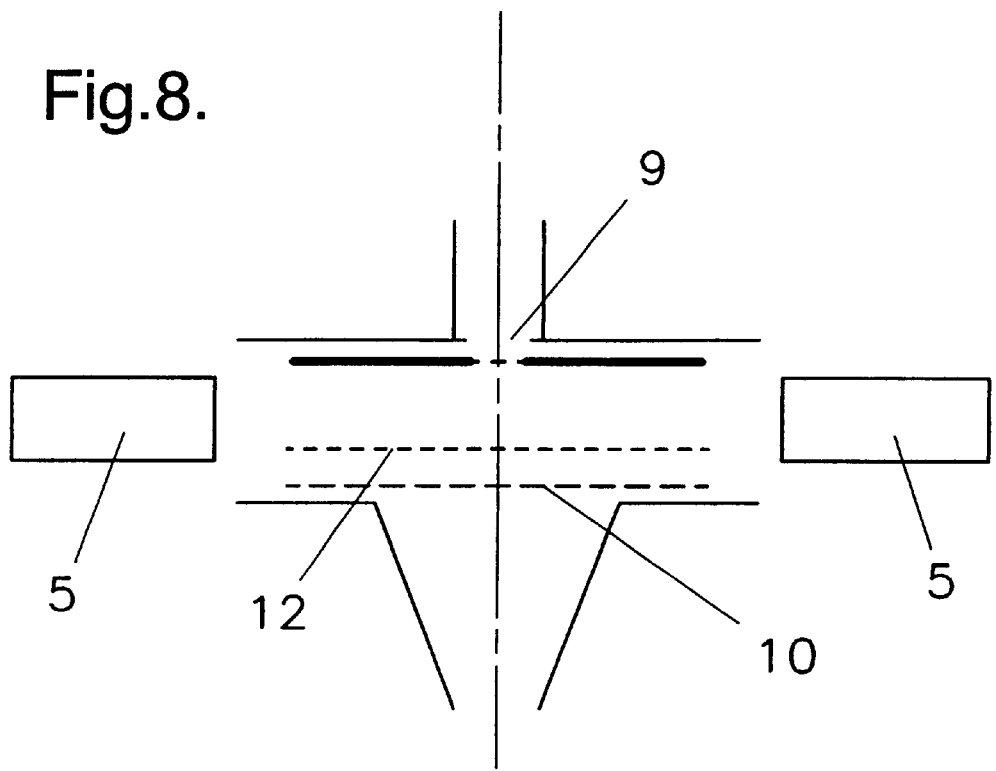

Further advantages and embodiments of the invention will be explained in greater detail with reference to the description of some embodiments and the drawings, in which:

FIG. 1 shows a schematic representation of the particle beam apparatus according to a first embodiment, FIG. 2 shows a schematic representation of the particle beam apparatus according to a second embodiment, FIG. 3 shows a schematic representation of the particle beam apparatus according to a third embodiment, FIG. 4 shows a schematic representation of the particle beam apparatus according to a fourth embodiment, FIG. 5 shows a bottom view of detecting means according to a first embodiment, FIG. 6 shows a bottom view of detecting means according to a second embodiment, FIG. 7 shows a schematic view of detecting means according to a third embodiment and FIG. 8 shows a schematic view of detecting means according to a fourth embodiment.

A particle beam apparatus according to a first embodiment is disclosed in FIG. 1. It essentially comprises a source 1 for generating a primary particle beam 2, means 3 for focussing the primary particle beam onto a specimen 4, means 5 for detecting back-scattered and/or secondary electrons 6 released at the specimen 4, means 7 for accelerating the primary particle beam from a first energy to a second higher energy and means 8 to decelerate the primary particle beam to a final beam energy.

The detecting means 5 are located between the source 1 and the focussing means 3. Furthermore, there are provided first additional means 9 to decelerate the primary particle beam shortly before the detecting means 5 and second additional means 10 to accelerate the primary particle beam immediately after the detecting means 5.

The particle beam apparatus is particularly suitable as a scanning electron microscope for low voltage applications.

The source 1 comprises, for instance, an electron gun 1a, an extractor 1b and an anode 1c, the gun being preferably a thermal field effect emitter, a cold field emitter or a photo-cathode. The anode 1c also constitutes the accelerating means 7.

The decelerating means 8 are constituted by an immersion lens within the focussing means 3. The immersion lens comprises at least two electrodes 3a, 3b, whereby the first electrode 3a in the direction of. the primary particle has a higher potential than the second electrode 3b. The immersion lens generates a retarding field for the primary particle beam.

The back-scattered and/or secondary electrons 6 released at the specimen 4, however, will be accelerated by the immersion lens. Consequently, these secondary electrons, after passing the immersion lens, will have approximately the same high energy as the primary particles, which makes it difficult to detect the secondary electrons. However, according to the invention there are provided first and second additional means to decelerate and accelerate the primary particle beam in the region of the detecting means 5. Therefore, the detecting means 5 are arranged in a low energy zone. If the potential applied in the region of the detector corresponds to the potential applied at the specimen, the back-scattered and/or secondary electrons will be decelerated at the detecting means to their original energy distribution, which is, for instance, from 0 to 50 eV. Although the primary particles are also decelerated in the detector region, they still have an energy which is a multiple of the energy of the secondary particles. Consequently it is very easy to separate the secondary particles from the primary particles for its detection thereof.

The first and second additional means for decelerating and accelerating the primary particle beam can be generated by any kind of deceleration and acceleration lenses. The most simple case is a two-electrode lens, which consists of concentric holes or which is formed by grid electrodes. Also combinations of hole electrodes and grid electrodes are efficient. Furthermore all kinds of elements which have a deceleration and acceleration effect, e.g. Einzel lenses can be used and integrated in the signal detection concept.

In the embodiment of FIG. 1, the additional means 9 for decelerating the primary particle beam comprise a hole electrode 9a and the lower end of a liner tube 9b. The liner tube 9b may have a potential of for instance 8 kV and the hole electrode 9a has ground potential. The second additional means 10 for accelerating the primary particle beam and decelerating the secondary particles comprises a grid electrode 10a and the upper end of a liner tube 10b. The grid electrode 10a is, e.g. at ground potential while. the liner tube 10b has the same potential as the liner tube 9b.

FIG. 2 shows a particle beam apparatus according to a second embodiment. It differs from the first embodiment in that there is provided an additional lens 11, e.g. a condenser lens generating a crossover in the region of the detector means 5. This has the advantage that the optical effect of the additional means 9 and 10 on the primary beam performance is marginal and can be disregarded. because lenses or optical components in or near a crossover do not have any relevant effects on the beam characteristics.

The particle beam apparatus according to FIG. 3 does not have a retarding field within the focussing means 3, but realizes the deceleration of the primary particle beam to the final beam energy between the focussing means 3 and the specimen. The focussing means 3 has an electrode being at a high potential, e.g. 8 kV, and the specimen is at ground potential. However, it would also be possible to perform the deceleration by biasing the specimen.

FIG. 4 discloses a particle beam apparatus having an immersion lens 8 for decelerating the primary particle beam to the final beam energy consisting of two or more electrodes. The magnetic lens of the focussing means 3 is arranged behind the specimen as a single pole lens.

Of course, the above mentioned embodiments have further elements, as elements for beam alignment, stigmatizing, scanning and aperture limiting and so on, which are not mentioned in detail.

The second addtional means 10 are adapted to accelerate again the primary particle beam to a third energy, which may correspond to the second energy. The second and/or third energy is at least three times, preferably five times, higher than the final energy. The final energy is preferably lower than 5 keV.

In principle, many kinds of effective detection systems can be applied. FIG. 5 discloses a bottom view of an annular detector 5 having a hole 5a in the middle for the penetration of the primary particle beam. FIG. 6 discloses a segmented detector 5.

However, it is also possible to provide off-axial detectors in one direction (FIG. 7) or two directions (FIG. 8) or an even higher number of directions. Off-axial detectors can be supported by the application of a Wien filter, which consists of crossed electrostatic and magnetic deflection fields as indicated in FIG. 7, which do not disturb the primary beam, but deflect the back-scattered and secondary electrons to the off-axial detector. Also a quadrupole Wien filter can be used, if the secondary particles should be divided over two off-axial detectors.

An additional advantage of this detector area is that filter electrodes 12 can be arranged in this area. FIG. 7 shows an embodiment with a filter electrode 12 in front of the detector 5, while FIG. 8 discloses an axial filter electrode 12. These filter electrodes can be used for energy-selective detection of the signal electrons (back-scattered and/or secondary electrons). It will also be possible to provide combinations of on-axial detectors, off-axial detectors and/or additional filter electrodes. They will deliver valuable signals, which can be used either alone or in any combination for image analysis.

The distance, in the direction of the primary particle beam, between the first and second additional means to decelerate and accelerate the primary particle beam is less than 30 mm.

Highest optical performance for the primary electron beam is to be expected because most of the primary beam path is at a high energy level. Furthermore, the prelens detector location provides a short focal length and a low aberration coefficient. By having a low energy level in the region of the detector means, a high back-scattered and/or secondary electron detection efficiency is to be expected and the present apparatus is especially useful for signal capturing from the bottom of holes in specimens (e.g. contact holes in semiconductor technology).

What is claimed is:

1. Particle beam apparatus with
   a source (1) for generating a primary particle beam (2),
   means (3) for focussing the primary particle beam onto a specimen (4),
   means (5) for detecting backscattered and/or secondary electrons (6) released at the specimen (4), said detecting means being located between said source (1) and said focussing means (3),
   means (7) to accelerate the primary particle beam (2) from a first energy to a second higher energy and
   means (8) to decelerate the primary particle beam (2) to a final beam energy,
   characterized in that there are provided
   first additional means (9) to decelerate the primary particle beam (2) shortly before the detecting means (5) and
   second additional means (10) to accelerate the primary particle beam (2) immediately after the detecting means (5).

2. Particle beam apparatus according to claim 1, characterized in that the detecting means (5) are located in the region of a crossover of the primary particle beam.

3. Particle beam apparatus according to claim 1, characterized in that the first additional means are adapted to decelerate the primary particle beam from the second energy to an energy in the range of the final beam energy.

4. Particle beam apparatus according to claim 1, characterized in that the second additional means (10) are adapted to accelerate again the primary particle beam to a third energy.

5. Particle beam apparatus according to claim 4, characterized in that the second and/or third energy is at least three times, preferably five times, higher than the final energy.

6. Particle beam apparatus according to claim 1, characterized in that the distance in the direction of the primary particle beam between the first and second additional means (9, 10) is less than 30 mm.

7. Particle beam apparatus according to claim 1, characterized in that the focussing means (3) comprise a combined electrostatic/magnetical retarding field objective lens.

8. Particle beam apparatus according to claim 1, characterized in that the detecting means (5) is an annular detector.

9. Particle beam apparatus according to claim 1, characterized in that the detecting means (5) is a segmented detector.

10. Particle beam apparatus according to claim 1, characterized in that the detecting means (5) is an off-axial detector in one or more directions.

11. Particle beam apparatus according to claim 1, characterized in that the second and/or third energy is at least 5 keV.

12. Particle beam apparatus according to claim 1, characterized in that the final energy is lower than 5 keV.

13. Particle beam apparatus according to claim 1, characterized in that the particle beam apparatus is a scanning electron microscope for low voltage applications.

* * * * *